(12) United States Patent
Chang et al.

(10) Patent No.: US 10,658,046 B2
(45) Date of Patent: *May 19, 2020

(54) MEMORY DEVICE AND METHOD FOR OPERATING THE SAME

(71) Applicant: MACRONIX INTERNATIONAL CO., LTD., Hsinchu (TW)

(72) Inventors: Kuen-Long Chang, Taipei (TW); Ken-Hui Chen, Hsin Chu (TW); Su-Chueh Lo, Hsinchu (TW); Chun-Yu Liao, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/841,622

(22) Filed: Dec. 14, 2017

(65) Prior Publication Data

US 2018/0342302 A1    Nov. 29, 2018

Related U.S. Application Data

(60) Provisional application No. 62/511,356, filed on May 26, 2017.

(51) Int. Cl.
*G11C 7/10* (2006.01)
*G11C 16/26* (2006.01)
(Continued)

(52) U.S. Cl.
CPC .......... *G11C 16/26* (2013.01); *G06F 12/0246* (2013.01); *G06F 13/4004* (2013.01); *G11C 7/06* (2013.01); *G11C 7/1051* (2013.01); *G11C 7/1078* (2013.01); *G11C 11/4093* (2013.01); *G11C 16/0483* (2013.01); *G11C 16/20* (2013.01)

(58) Field of Classification Search
CPC .................... H01L 27/115; H01L 27/11521
USPC .................................................. 365/189.05
See application file for complete search history.

(56) References Cited

U.S. PATENT DOCUMENTS 5,557,771 A    9/1996  Kawaguchi et al.
5,822,244 A    10/1998 Hansen et al.
(Continued)

FOREIGN PATENT DOCUMENTS

TW    201230039 A    7/2012
TW    201230039 A1   7/2012

OTHER PUBLICATIONS

Chinese language Office Action dated Dec. 5, 2018, issued in application No. TW 106144021.

*Primary Examiner* — Huan Hoang
*Assistant Examiner* — Minh Dinh
(74) *Attorney, Agent, or Firm* — McClure, Qualey & Rodack, LLP

(57) ABSTRACT

The embodiment of the present invention discloses a memory device and a method for operating the same. The memory device includes a memory array and a logic circuit. The logic circuit is coupled to the memory array, and is configured to perform a corresponding operation in response to an operation command from a controller. When an interruption event occurs during the corresponding operation, the logic circuit records a memory status, and the logic circuit further is configured to output the memory status to the controller in response to a status read command from the controller.

10 Claims, 3 Drawing Sheets

(51) Int. Cl.

| | |
|---|---|
| *G11C 16/04* | (2006.01) |
| *G11C 7/06* | (2006.01) |
| *G06F 12/02* | (2006.01) |
| *G11C 11/4093* | (2006.01) |
| *G06F 13/40* | (2006.01) |
| *G11C 16/20* | (2006.01) |

(56) References Cited

U.S. PATENT DOCUMENTS

| | | |
|---|---|---|
| 7,349,245 B2 | 3/2008 | Kim et al. |
| 8,004,884 B2 | 8/2011 | Franceschini et al. |
| 8,850,103 B2 | 9/2014 | Bennett |
| 9,361,956 B2 * | 6/2016 | Jeon .................... G11C 11/4093 |
| 10,101,933 B2 * | 10/2018 | Eguchi .................. G06F 3/0625 |
| 2015/0161004 A1 * | 6/2015 | Camp .................. G06F 11/1076 |
| | | 714/6.24 |

* cited by examiner

MEMORY DEVICE AND METHOD FOR OPERATING THE SAME

This application claims the benefit of U.S. provisional application Ser. No. 62/511,356, filed May 26, 2017, the disclosure of which is incorporated by reference herein in its entirety.

BACKGROUND OF THE INVENTION

Field of the Invention

The invention relates to a memory device and method for operating the same.

Description of the Related Art

With the advent of the computer age, computer systems are widely used in a wide variety of electronic products (such as personal computers, mobile phones, etc.). In general, the computer system is composed of hardware and software. Memory is one of the important components of the hardware components.

Memory can be used to store data and read when needed. Existing memory in the process of writing or reading a data, if for some reason was forced to interrupt (e.g., received other commands with higher priority), will cause the related information of writing or reading (e.g., initial address) miss, and may need to take additional time to write or read the data from the beginning. Besides, existing controllers (e.g., CPU) may not be able to acquire the execution status of the write operation or the read operation inside the memory.

In view of the problems stated above, how to provide a memory device and method for operating the same has become one of the important issues.

SUMMARY OF THE INVENTION

The embodiment of the present invention discloses a memory device including a memory array and a logic circuit. The logic circuit is coupled to the memory array, and is configured to perform a corresponding operation in response to an operation command from a controller. When an interruption event occurs during the corresponding operation, the logic circuit records a memory status, and the logic circuit further is configured to output the memory status to the controller in response to a status read command from the controller.

The embodiment of the present invention discloses a method for operating memory device comprising following steps. Receiving an operation command; and performing a corresponding operation in response to the operation command. When an interruption event occurs during the corresponding operation, records a memory status, and outputs the memory status in response to a status read command.

Memory device and method for operating the same according to the embodiments of the present invention may provide the memory status to the controller, and may be able to efficiently write/read the data sequence starting from the continued write/read address, thereby improving the overall performance of the memory device.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
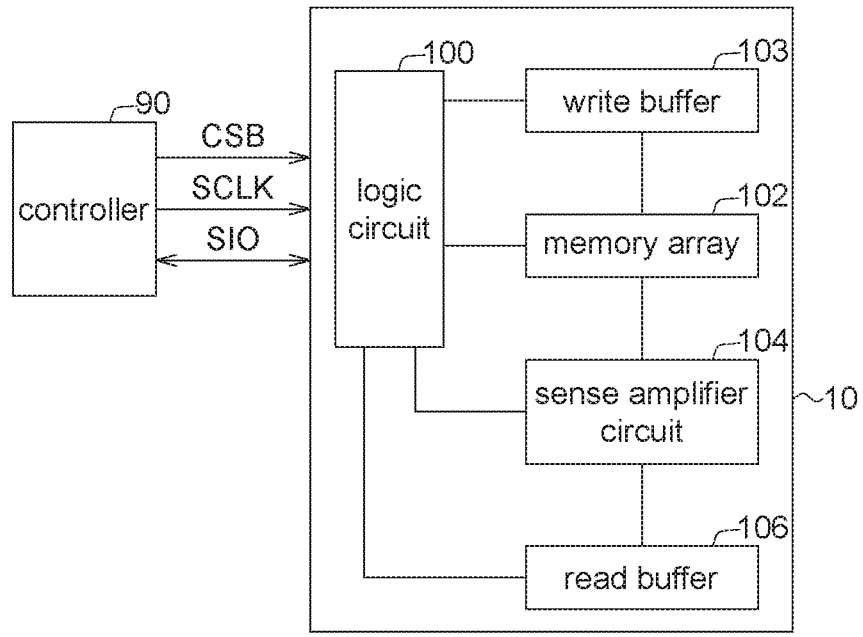
FIG. 1 shows a block diagram illustrating memory device according to an embodiment of the present invention.

Referring to FIG. 1, FIG. 1 shows a block diagram illustrating memory device according to an embodiment of the present invention. A memory device 10 is coupled to a controller 90, and is controlled by the controller 90. In the embodiment, the transmission interface between the memory device 10 and the controller 90 may be, for example, serial peripheral interface (SPI), and the invention is not limited by. The memory device 10 may be coupled to the controller through at least three signal buses CSB, SCLK, SIO.

The controller 90 selects or not selects the memory device 10 through the signal bus CSB. When the controller 90 selects the memory device 10, the memory device is in an operable state; on the contrary, when the controller 90 not selects the memory device 10, the memory device 10 is in an inoperable state. When the controller 90 selects the memory device 10, the controller 90 may transmits a clock signal to the memory device through the signal bus SCLK to control operation timings of the memory device 10. The controller 90 transmits write commands, read commands, erase commands, and etc. to the memory device 10 through the signal bus SIO. When the memory device 10 receives a command, the memory device 10 may execute corresponding operation according to the type of the command. Besides, the controller 90 and the memory device 10 may be able to transmit data to each other through the signal bus SIO. For example, during a write operation, the controller 90 transmits data to be written to the memory device 10 through the signal bus SIO; during a read operation, the memory device 10 transmits data to be read to controller 90 through the signal bus SIO.

The memory device 10 includes a logic circuit 100, a memory array 102, a write buffer 103, a sense amplifier circuit 104 and a read buffer 106.

The logic circuit 100 is configured to operate the memory array 102, the write buffer 103, the sense amplifier circuit 104 and the read buffer 106 in response to an operation command from the controller 90 according to the type of the operation command. For example, the logic circuit 100 may perform a write operation in response of a write command. The logic circuit 100 may also perform a read operation in response of a read command. Moreover, the logic circuit 100 may be configured to record a memory status when an interruption event occurs during the write operation or during the read operation.

The memory array 102 is coupled to the logic circuit 100. The memory array 102 may be non-volatile memory (NVM), e.g., NOR flash memory array, NAND flash memory array, and so on. The memory array includes a number of memory cells which may be co g red in 2D or 3D to for storing data.

The write buffer is coupled to the logic circuit 100 and the memory array 102. The write buffer 103 is configured to temporarily store data to be written into the memory array 102.

The sense amplifier circuit 104 is coupled to the logic circuit 100 and the memory array 102. The sense amplifier circuit 104 may be configured to sense data stored in the memory array 102, and read data from the memory array 102. After the sense amplifier circuit 104 read a data, the data may be temporarily stored in the read buffer 106.

The read buffer 106 is coupled to the logic circuit 100 and the sense amplifier circuit 104. The read buffer 106 may be configured to temporarily store the data read by the sense amplifier circuit 104 and to output the data to the controller 90.

Figure 2:
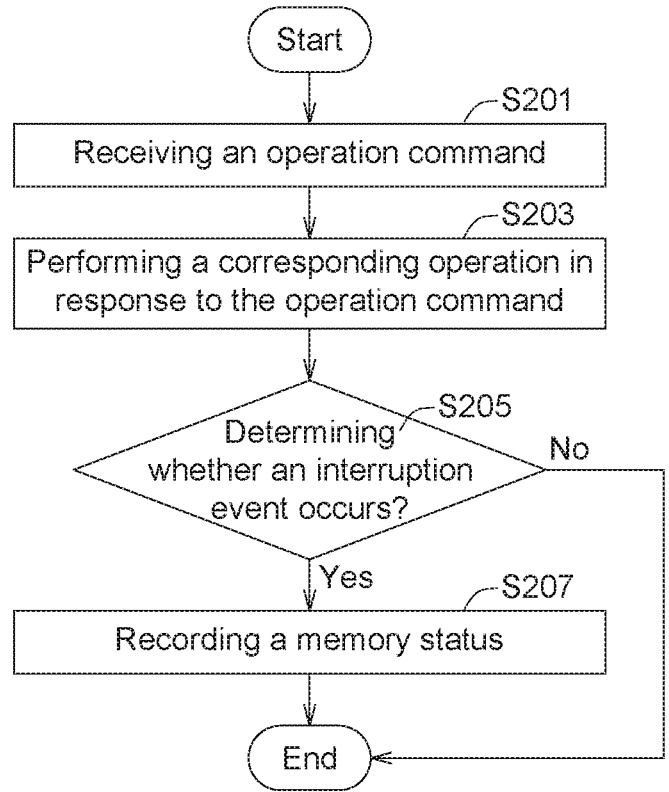
FIG. 2 shows a flow chart illustrating method for operating memory device according to an embodiment of the present invention.

Referring to FIG. 2, FIG. 2 shows a flow chart illustrating method for operating memory device according to an embodiment of the present invention. A method for operating memory device including steps S201-S207, which may be used to operate the memory device 10.

In step S201, receiving an operation command is performed. The operation command is transmitted by the controller 90, and received by the logic circuit 100. The operation command is, for example, a write command or a read command.

In step S203, performing a corresponding operation in response to the operation command is performed. When the operation command is a write command, the logic circuit 100 performs the write operation in response to the write command. When the operation command is a read command, the logic circuit 100 performs the read operation in response to the write command.

Furthermore, during the write operation, the controller 90 not only transmits the write command to the memory device 10, but also transmits a first data sequence to be written and an initial write address. The initial write address is used to indicate a write buffer address in the write buffer 103 or a memory address in the memory array 102 to which the first bit of the first data sequence is to be written. In general, the write buffer address is corresponding to the memory address. In this embodiment, it is assumed that the initial write address employs the write buffer address.

During the write operation, the logic circuit 100 temporarily stores the initial write address to an address buffer (not shown). Then, the logic circuit 100 temporarily stores the first data sequence into the write buffer 103 according to the initial write address. When all of the first data sequence is transmitted from the controller 90 to the memory device 10, the controller 90 may transmits a write confirm command to indicate the logic circuit 100 to write the first data sequence temporarily stored in the e buffer 103 into the memory array 102. When all of the first data sequence is written into the memory array 102, the write operation is finished.

On the other hand, during the read operation, the controller 90 not only transmits the read command to the memory device 10, but also transmits an initial read address. The initial read address is used to indicate a memory address in the memory array 102 to which the first bit of a second data sequence is to be read. In general, the write buffer address is corresponding to the memory address.

During the read operation, the logic circuit 100 temporarily stores the initial read address to the address buffer. Then, the logic circuit 100 indicates the sense amplifier circuit 104 to read the second data sequence from the memory array 102 according to the initial read address and temporarily stores into the read buffer 106. The second data sequence temporarily stored in the read buffer 106 is sequentially output to the controller 90. When all of the second data sequence is outputted to the controller 90, the read operation is finished.

In step S205, determining whether an interruption event occurs. The interruption event refers to an event that causes the corresponding operation (step S203) to be interrupted before completion. For example, the interruption event may be receiving a command with higher priority than the operation command. In some cases, the priority of a read command is higher than the priority of a write command. Thus, when the operation command is a write command, the interruption event may be receiving a read command. On the contrary, in some cases, the priority of a write command is higher than the priority of a read command. Thus, when the operation command is a read command, the interruption event may be receiving a write command. The present invention is not limited by.

In step S207, recording a memory status. The memory status may be recorded by the logic circuit 100. The contents of the memory status may depend on the corresponding operation. The contents of the memory status will be described below.

In first case, it is assumed that the operation command is the write command, and the corresponding operation is the write operation. In first case, the interruption event may occur during the logic circuit 100 temporarily storing the first data sequence into the write buffer 103. That is, when the interruption event occurs, part of or all of the first data sequence may have been temporarily stored in the write buffer 103. After the interruption event occurs, the logic circuit 100 may records the state of the write operation performed, i.e., the memory status. The memory status may include at least one of the initial write address, an interrupted write address, a continued write address and a write initialized flag. The interrupted write address refers to a write buffer address in the write buffer 103 (or a corresponding memory address in the memory array 102) in which the last bit of the part (or all) of the first data sequence that have been stored when the interruption event occurs. The continued write address refers to a write buffer address (or a corresponding memory address) from which the rest part of the first data sequence starts to be written when perform a write continue operation after the end of the interruption event. In some embodiments, the continued write address may be the next address of the interrupted write address. The write initialized flag refers to a flag indicating whether the logic circuit 100 has successfully received/recognized the write command. For example, when the waveform of the write command does not match the specification so that the logic circuit 100 fails to recognize, the write initialized flag is set to fail. It should be noted that even if the write command fails to be received/recognized by the logic circuit 100 and step S203 fails to be performed, the logic circuit 100 can still set the write initialized flag to fail and record as the memory status.

In second case, it is assumed that the operation command is the read command, and the corresponding operation is the read operation. In second case, the interruption event may occur during the sense amplifier circuit 104 reading the second data sequence from the memory array 102. That is, when the interruption event occurs, part of or all of the second data sequence may have been read from the memory array 102 by the sense amplifier circuit 104. After the interruption event occurs, the logic circuit 100 may records the state of the read operation performed, i.e., the memory status. The memory status may include at least one of the initial read address, a interrupted read address, a continued read address and a read initialized flag. The interrupted read address refers to a memory address in the memory array 102 in which the last bit of the part (of all) of the second data sequence that have been read by the sense amplifier circuit 104 when the interruption event occurs. The continued read address refers to a memory address from which the rest part of the second data sequence starts to be read when perform a read continue operation after the end of the interruption event. In some embodiments, the continued read address may be the next address of the interrupted read address. The read initialized flag refers to a flag indicating whether the logic circuit 100 has successfully received/recognized the read command. For example, when the waveform of the read command does not match the specification so that the logic circuit 100 fails to recognize, the read initialized flag is set to fail. It should be noted that even if the read command fails to be received/recognized by the logic circuit 100 and step S203 fails to be performed, the logic circuit 100 can still set the read initialized flag to fail and record as the memory status.

Figure 3:
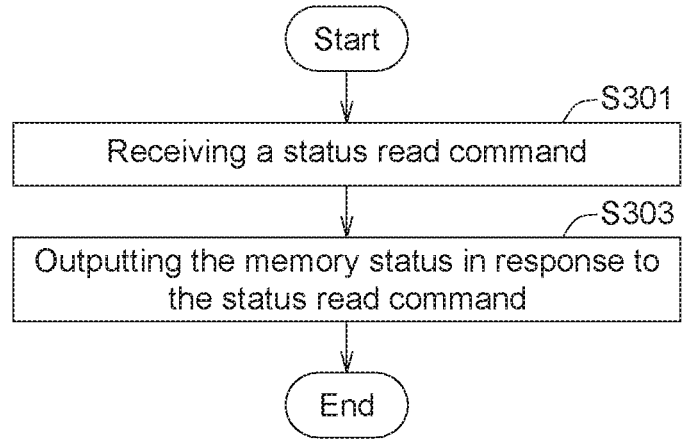
FIG. 3 shows a flow chart illustrating status read operation method in method for operating memory device according to an embodiment of the present invention.

Referring to FIG. 3, FIG. 3 shows a flow chart illustrating status read operation method in method for operating memory device according to an embodiment of the present invention. Status read operation method may be performed after step S207. More specifically, when the interruption event ends, the controller 90 may indicate the memory device 10 to report the memory status to understand the state of the corresponding operation performed. Status read operation method includes step S301 and step S303.

In step S301, receiving a status read command. The status read command is transmitted from the controller 90 to the memory device 10.

In step S303, outputting the memory status in response to the status read command. When the memory device 10 receives the status read command, the logic circuit 100 performing a status read operation. During the status read operation, the logic circuit 100 may output the memory status to the controller 90. The controller 90 may be able to instruct further instructions according to the memory status, e.g., write continue command or read continue command.

Figure 4:
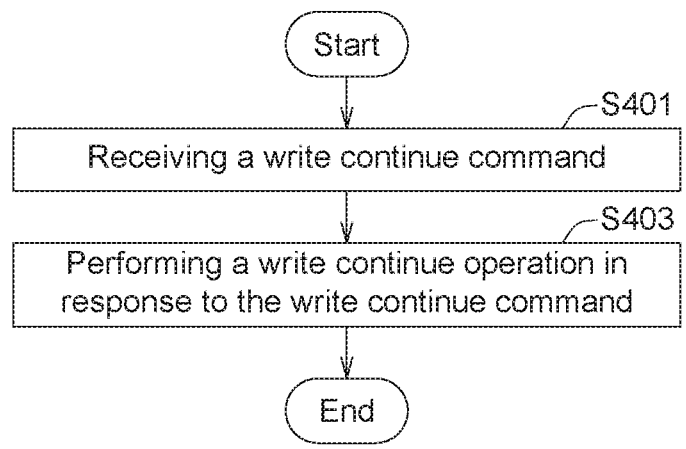
FIG. 4 shows a flow chart illustrating write continue operation method in method for operating memory device according to an embodiment of the present invention.

Referring to FIG. 4, FIG. 4 shows a flow chart illustrating write continue operation method in method for operating memory device according to an embodiment of the present invention. When the operation command is the write command, write continue operation method may be performed after step S303. Write continue operation method includes step S401 and step S403.

In step S401, receiving a write continue command is performed. The write continue command may be generated and transmitted according to the memory status by the controller 90.

In step S403, performing a write continue operation in response to the write continue command is performed. In some embodiments, through the memory status, the controller 90 may know which part of the first data sequence has been temporarily stored in the write buffer 103. The write continue command may include the continued write address, and the controller 90 may transmit the rest part of the first data sequence to the memory device 10. The logic circuit 100 temporarily stores the rest part of the first data sequence which has not been temporarily stored into the write buffer 103 according to the write continue command (starting from the continued write address). In some embodiments, the write continue command may not include the continued write address. The logic circuit 100 may temporarily stores the rest part of the first data sequence which has not been temporarily stored into the write buffer 103 according to the memory status recorded by the logic circuit 100 itself. In other words, even if the controller 90 does not indicate the continued write address with the write continue command, the logic circuit 100 may still be able to temporarily stores the rest part of the first data sequence which has not been temporarily stored to the correct write buffer address.

Figure 5:
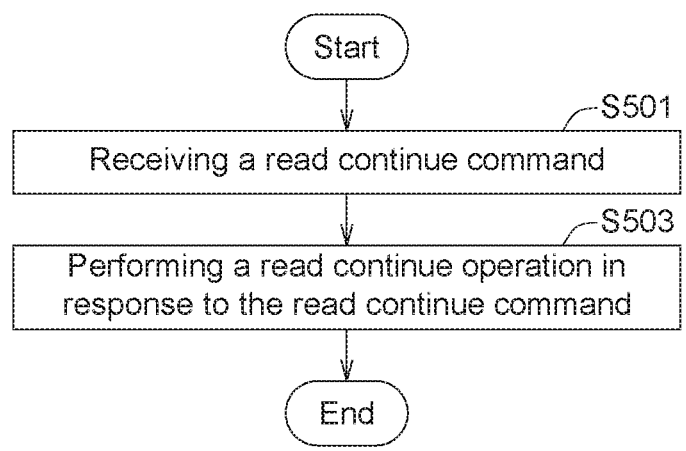
FIG. 5 shows a flow chart illustrating read continue operation method in method for operating memory device according to an embodiment of the present invention.

Referring to FIG. 5, FIG. 5 shows a flow chart illustrating read continue operation method in method for operating memory device according to an embodiment of the present invention. When the operation command is the read command, read continue operation method may be performed after step S303. Read continue operation method includes step S501 and step S503.

In step S501, receiving a read continue command is performed. The read continue command may be generated and transmitted according to the memory status by the controller 90.

In step S503, performing a read continue operation in response to the read continue command is performed. In some embodiments, through the memory status, the controller 90 may know which part of the second data sequence has been read by the sense amplifier circuit 104. The read continue command may include the continued read address. The logic circuit 100 indicates the sense amplifier circuit 104 to read the rest part of the second data sequence which has not been read from the memory array 102 according to the read continue command (starting from the continued read address). In some embodiments, the read continue command may not include the continued read address. The logic circuit 100 may indicate the sense amplifier circuit 104 to read the rest part of the second data sequence which has not been read from the memory array 102 according to the memory status recorded by the logic circuit 100 itself. In other words, even if the controller 90 does not indicate the continued read address with the read continue command, the logic circuit 100 may still be able to indicate the correct memory address for the sense amplifier reading the rest part of the second data sequence which has not been read.

Besides, execution of the write continue operation may be regarded as execution of the write operation, and execution of read continue operation may also be regarded as execution of the reading operation. Thus, the logic circuit 100 may also record the memory status when the interruption event occurs during performing the write continue operation or the read continue operation.

Figure 6:
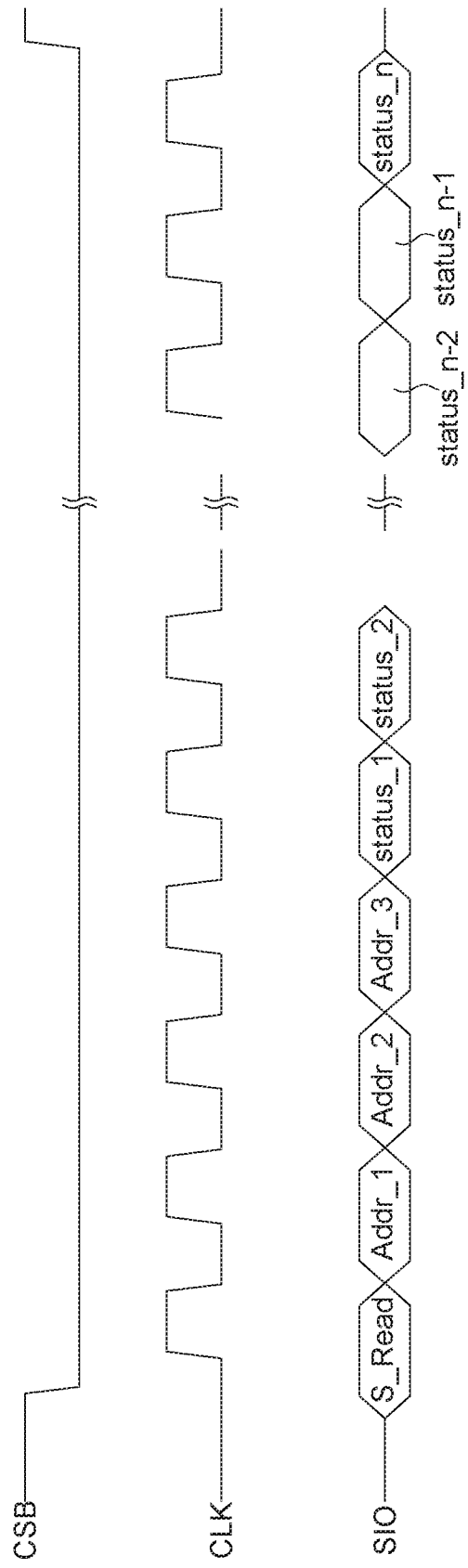
FIG. 6 shows a timing diagram of status read operation method in method for operating memory device according to an embodiment of the present invention.

Referring to FIG. 6, FIG. 6 shows a timing diagram of status read operation method in method for operating memory device according to an embodiment of the present invention. As shown in FIG. 6, controller 90 selects the memory device 10 through the signal bus CSB to make the memory device 10 under the operable state. When the memory device 10 is under the operable state, the controller 90 transmits the clock signals to the memory device 10 through the signal bus CLK to control the execution timing of the memory device 10. Then, the controller 90 transmits the status read command S_Read and target status address Addr_1, Addr_2, Addr_3 to the memory device 10 through the signal bus SIO. The target status address may be used to indicate which memory status the memory device 10 should output. In response to the status read command S_Read, the memory device 10 outputs the memory status status_1~status_n to the controller 90 through the signal bus SIO. The memory status may be one or a number of bit(s), or one or a number of byte(s), the present invention is not limited by. It should be noted that, in the embodiment, the memory device 10 may records a number of memory statuses. The controller 90 obtains the desired memory status by sending the target status address. In some embodiments, the target status address is included in the status read command, or the controller 90 may not send the target status address.

Memory device and method for operating the same according to the embodiments of the present invention may record the memory status when the interruption event occurs during the write/read operation, and may output the memory status to controller during the status read operation. By obtaining the memory status, the controller may be able to know the execution state of the write/read operation when it is interrupted. In addition, the controller is able to issue the write/read continue command to the memory device according to the memory status to instruct the memory device to complete the write/read operation that is interrupted by the interruption event. Since the write/read operation can be performed according to the memory status, it is possible to efficiently write/read the data sequence starting from the continued write/read address, thereby improving the overall performance of the memory device.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a memory array;
   a logic circuit, coupled to the memory array, the logic circuit configured to perform a corresponding operation in response to an operation command from a controller; and
   a sense amplifier circuit, coupled to the logic circuit and the memory array;
   wherein when an interruption event occurs during the corresponding operation, the logic circuit records a memory status, and the logic circuit is further configured to output the memory status to the controller in response to a status read command from the controller; and
   wherein the operation command is a read command, the corresponding operation is a read operation, the sense amplifier circuit is configured to read a second data sequence from the memory array, and the memory status includes a continued read address.

2. The memory device according to claim 1, further comprising:
   a write buffer, coupled to the logic circuit, wherein the write buffer is configured to temporarily store a first data sequence from the controller.

3. The memory device according to claim 2, wherein when the interruption event occurs, part of the first data sequence has been temporarily stored in the write buffer.

4. The memory device according to claim 1, wherein the memory status includes at least one of an initial read address, an interrupted read address and a read initialized flag.

5. The memory device according to claim 4, wherein when the interruption event occurs, part of the second data sequence has been read from the memory array, the logic circuit is further configured to perform a read continue operation in response to a read continue command which is generated according to the memory status by the controller, during the read continue operation, the logic circuit indicates the sense amplifier circuit to read the rest part of the first data sequence from the memory array.

6. The memory device according to claim 4, wherein when the interruption event occurs, part of the second data sequence has been read from the memory array, the logic circuit is further configured to perform a read continue operation in response to a read continue command which is generated according to the memory status by the controller, during the read continue operation, the logic circuit indicates the sense amplifier circuit to read the rest part of the first data sequence from the memory array according to the memory status.

7. A method for operating memory device, comprising:
   receiving an operation command; and
   performing a corresponding operation in response to the operation command,
   wherein when an interruption event occurs during the corresponding operation, records a memory status, and outputs the memory status in response to a status read command; and
   wherein the operation command is a read command, the corresponding operation is a read operation, during the read operation, reads a second data sequence from a memory array, and the memory status includes a continued read address.

8. The memory device according to claim 7, wherein the memory status includes at least one of an initial read address, an interrupted read address and a read initialized flag.

9. The memory device according to claim 8, wherein when the interruption event occurs, part of the second data sequence has been read from the memory array, performs a read continue operation in response to a read continue command which is generated according to the memory status, during the read continue operation, reads the rest part of the first data sequence from the memory array.

10. The memory device according to claim 8, wherein when the interruption event occurs, part of the second data sequence has been read from the memory array, performs a read continue operation in response to a read continue command which is generated according to the memory status, during the read continue operation, reads the rest part of the first data sequence from the memory array according to the memory status.

* * * * *